US012795843B2

(12) United States Patent
Lee et al.

(10) Patent No.: US 12,795,843 B2
(45) Date of Patent: Nov. 10, 2026

(54) DISPLAY DEVICE

(71) Applicant: LG ELECTRONICS INC., Seoul (KR)

(72) Inventors: Jaehun Lee, Seoul (KR); Seunggyu Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 94 days.

(21) Appl. No.: 18/837,669

(22) PCT Filed: Dec. 22, 2022

(86) PCT No.: PCT/KR2022/021060
§ 371 (c)(1),
(2) Date: Aug. 12, 2024

(87) PCT Pub. No.: WO2023/153628
PCT Pub. Date: Aug. 17, 2023

(65) Prior Publication Data
US 2025/0151212 A1 May 8, 2025

(30) Foreign Application Priority Data
Feb. 10, 2022 (KR) ........................ 10-2022-0017481

(51) Int. Cl.
*H05K 5/00* (2025.01)
*H05K 5/02* (2006.01)

(52) U.S. Cl.
CPC .................................. *H05K 5/0217* (2013.01)

(58) Field of Classification Search
CPC ................................ H05K 5/0217; G06F 1/16
See application file for complete search history.

(56) References Cited

U.S. PATENT DOCUMENTS 9,116,662 B1 * 8/2015 Song ..................... G06F 1/1601
2015/0145837 A1 * 5/2015 Park ................. H04N 21/41265
345/184

(Continued)

FOREIGN PATENT DOCUMENTS

JP 2005309445 11/2005
KR 1020140117182 10/2014

(Continued)

OTHER PUBLICATIONS

Korean Intellectual Property Office Application No. 10-2022-0017481, Office Action dated Aug. 21, 2024, 5 pages.

(Continued)

*Primary Examiner* — Imani N Hayman
*Assistant Examiner* — Rashen E Morrison
(74) *Attorney, Agent, or Firm* — LEE, HONG, DEGERMAN, KANG & WAIMEY

(57) ABSTRACT

A display device is disclosed. The display device comprises: a flexible display panel; a flexible rear plate which is positioned at a rear side of the display panel and to which the display panel is coupled; a flexible inner plate coupled to the rear plate between the rear plate and the display panel; a driving module which is coupled to a rear side of the rear plate and is provided with a slider which linearly reciprocates; a wing which is elongated so that one end thereof is coupled to the slider and the other end thereof is coupled to the rear side of the rear plate, and which is provided with a pivot shaft which is positioned adjacent to the one end between the one end and the other end; and a wing bracket which is fixed to the rear side of the rear plate adjacent to the pivot shaft and is coupled to the pivot shaft, wherein the inner plate is positioned between the one end and the other end of the wing and comprises a plurality of holes formed by punching the inner plate, wherein the plurality of holes form (Continued)

rows and columns and may be elongatedly arranged in a direction crossing the longitudinal direction of the wing.

14 Claims, 27 Drawing Sheets

(56) References Cited

U.S. PATENT DOCUMENTS

| | | | | |
|---|---|---|---|---|
| 2015/0195932 | A1* | 7/2015 | Lee | H04N 5/64 361/749 |
| 2015/0223358 | A1* | 8/2015 | Nam | G06F 1/1652 74/102 |
| 2015/0296641 | A1* | 10/2015 | Song | F16M 11/18 361/679.01 |
| 2017/0347466 | A1* | 11/2017 | Kang | G09G 3/20 |
| 2020/0333846 | A1 | 10/2020 | Jan et al. | |
| 2022/0351649 | A1* | 11/2022 | Park | F16M 11/08 |
| 2023/0393614 | A1* | 12/2023 | Kim | F16M 11/08 |

FOREIGN PATENT DOCUMENTS

| | | |
|---|---|---|
| KR | 101720178 | 3/2017 |
| KR | 1020180024713 | 3/2018 |
| KR | 102193921 | 12/2020 |
| KR | 1020210061947 | 5/2021 |

OTHER PUBLICATIONS

PCT International Application No. PCT/KR2022/021060, International Search Report dated Apr. 14, 2023, 2 pages.
European Patent Office Application Serial No. 22926225.8, Search Report dated Mar. 26, 2025, 10 pages.

* cited by examiner

DISPLAY DEVICE

CROSS-REFERENCE TO RELATED APPLICATION(S)

This application is the National Stage filing under 35 U.S.C. 371 of International Application No. PCT/KR2022/021060, filed on Dec. 22, 2022, which claims the benefit of earlier filing date and right of priority to Korean Application No. 10-2022-0017481, filed on Feb. 10, 2022, the contents of which are all incorporated by reference herein in their entirety.

TECHNICAL FIELD

The present disclosure relates to a display device. More particularly, the present disclosure relates to a display device capable of changing the curvature of a display panel.

BACKGROUND ART

With the development of information society, there has been a growing demand for various types of display devices. In order to meet such demand, various display devices, such as a liquid crystal display (LCD), an electro luminescent display (ELD), a vacuum fluorescent display (VFD), an organic light emitting diode (OLED), and the like, have been developed and used.

Among them, an OLED panel can display an image by depositing an organic layer capable of emitting light on a substrate on which a transparent electrode is formed. OLED panels are not only thin but also have flexible characteristics. Numerous research has been conducted on structural characteristics of a display device including such an OLED panel.

DISCLOSURE

Technical Problem

It is an objective of the present disclosure to solve the above and other problems. It is another objective of the present disclosure to provide a structure that allows the curvature of a display panel to be freely changed.

It is yet another objective of the present disclosure to provide a mechanism that allows the curvature of a display to be freely changed.

It is yet another objective of the present disclosure to provide a display device that can be curved with a constant curvature.

Technical Solution

According to an aspect of the subject matter described in this application, a display device includes: a flexible display panel; a flexible rear plate positioned at a rear of the display panel and to which the display panel is coupled; a flexible inner plate disposed between the rear plate and the display panel so as to be coupled to the rear plate; a drive moule coupled to a rear of the rear plate, the drive module including a slider configured to linearly reciprocate; a wing that is elongated so that a first end of the wing is coupled to the slider and a second end of the wing is coupled to the rear of the rear plate, the wing including a pivot shaft positioned between the first end and the second end while being adjacent to the first end; and a wing bracket fixed to the rear of the rear plate while being adjacent to the pivot shaft, the wing bracket being coupled to the pivot shaft, wherein the inner plate includes a plurality of holes positioned between the first end and the second end of the wing and formed by punching the inner plate, and the plurality of holes are formed in rows and columns and arranged long in a direction intersecting a longitudinal direction of the wing.

Advantageous Effects

According to at least one of the embodiments of the present disclosure, it is possible to provide a structure that allows the curvature of a display panel to be freely changed.

According to at least one of the embodiments of the present disclosure, it is possible to provide a mechanism that allows the curvature of a display to be freely changed.

According to at least one of the embodiments of the present disclosure, it is possible to provide a display device capable of being curved with a constant curvature.

Further scope of applicability of the present disclosure will become apparent from the following detailed description. However, it should be understood that the detailed description and specific embodiments such as preferred embodiments of the present disclosure are given by way of example only, since various changes and modifications within the idea and scope of the present disclosure may be clearly understood by those skilled in the art.

MODE FOR THE INVENTION

Figure 1:
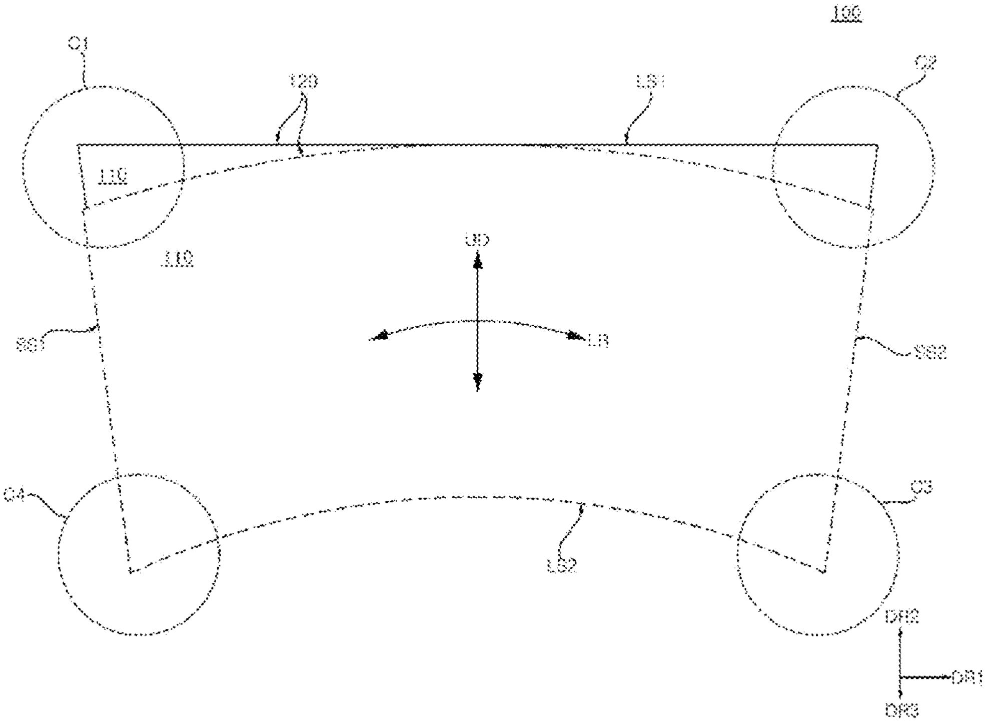
FIGS. 1 to 27 are diagrams illustrating examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In the following description, a suffix such as "module" and "unit" may be used to refer to elements or components. Use of such a suffix herein is merely intended to facilitate description of the specification, and the suffix itself is not intended to give any special meaning or function. In the present disclosure, that which is well known to one of ordinary skill in the relevant art has generally been omitted for the sake of brevity. The accompanying drawings are used to help easily understand the technical idea of the present disclosure and it should be understood that the idea of the present disclosure is not limited by the accompanying drawings. The idea of the present disclosure should be construed to extend to any alterations, equivalents, and substitutes besides the accompanying drawings.

Although the terms "first", "second", etc. may be used herein to describe various elements, these elements should not be limited by these terms. These terms are only used to distinguish one element from another.

It will be understood that when a component is referred to as being "connected to" or "coupled to" another component, it may be directly connected to or coupled to another component, or intervening components may be present. In contrast, when a component is referred to as being "directly connected to" or "directly coupled to" another component, there are no intervening components present.

As used herein, a singular representation is intended to include a plural representation unless the context clearly indicates otherwise.

It will be further understood that the terms "comprises or includes" and/or "has" when used in this specification, specify the presence of a stated feature, number, step, operation, component, element, or combination thereof, but do not preclude the presence or addition of one or more other features, numbers, steps, operations, components, elements, or combinations thereof.

Hereinafter, an organic light emitting diode (OLED) panel will be described as an example of a display panel, but the display panel applicable to the present disclosure is not limited to the OLED panel.

In the following description, a display device may include a first long side LS1, a second long side LS2 opposite the first long side LS1, a first short side SS1 adjacent to one end of the first long side LS1 and one end of the second long side LS2, and a second short side SS2 opposite the first short side SS1.

Here, an area of the first short side SS1 may be referred to as a first side area; an area of the second short side SS2 may be referred to as a second side area opposite the first side area; an area of the first long side LS1 may be referred to as a third side area that is adjacent to the first side area and the second side area and positioned between the first side area and the second side area; and an area of the second long side LS2 may be referred to as a fourth side area that is adjacent to the first side area and the second side area, positioned between the first side area and the second side area, and opposite the third side area.

For ease of explanation, it is illustrated and described that lengths of the first and second long sides LS1 and LS2 are greater than lengths of the first and second short sides SS1 and SS2, but the lengths of the first and second long sides LS1 and LS2 may be substantially equal to the lengths of the first and second short sides SS1 and SS2.

A first direction DR1 may be a direction parallel to the long sides LS1 and LS2 of the display device, and a second direction DR2 may be a direction parallel to the short sides SS1 and SS2 of the display device. A third direction DR3 may be a direction perpendicular to the first direction DR1 and/or the second direction DR2.

The first direction DR1 and the second direction DR2 may be collectively referred to as a horizontal direction. The third direction DR3 may be referred to as a vertical direction.

A side on which the display device displays an image may be referred to as a front or a front side or surface. When the display device displays an image, a side from which the image cannot be viewed may be referred to as a rear or a rear side or surface. When the display device is viewed from the front or the front surface, the first long side LS1 may be referred to as an upper side or an upper surface. Likewise, the second long side LS2 may be referred to as a lower side or a lower surface. Likewise, the first short side SS1 may be referred to as a left side or a left surface, and the second short side SS2 may be referred to as a right side or a right surface.

The first long side LS1, the second long side LS2, the first short side SS1, and the second short side SS2 may be referred to as edges of the display device. In addition, points where the first long side LS1, the second long side LS2, the first short side SS1, and the second short side SS2 meet one another may be referred to as corners. For example, a point where the first long side LS1 and the first short side SS1 meet may be referred to as a first corner C1; a point where the first long side LS1 and the second short side SS2 meet may be referred to as a second corner C2; a point where the second short side SS2 and the second long side LS2 meet may be referred to as a third corner C3; and a point where the second long side LS2 and the first short side SS1 meet may be referred to as a fourth corner C4.

Here, a direction from the first short side SS1 to the second short side SS2 or a direction from the second short side SS2 to the first short side SS1 may be referred to as a left-and-right direction LR. A direction from the first long side LS1 to the second long side LS2 or a direction from the second long side LS2 to the first long side LS1 may be referred to as an up-and-down direction UD.

Referring to FIG. 1, a plate 120 may be flexible. For example, the plate 120 may be a metal plate. The plate 120 may be referred to as a flexible plate 120, a frame 120, a module cover 120, or a rear plate 120. A display panel 110 may be disposed on a front side or front surface of the plate 120. The display panel 110 may be flexible. For example, the display panel 110 may be an OLED panel.

The display panel 110 may be provided on a front surface of the display device 100 and may display an image. The display panel 110 may include a plurality of pixels to output an image in accordance with color, brightness, and chroma of each pixel. The display panel 110 may generate light corresponding to red, green, or blue color according to a control signal.

The display device 100 may have a variable curvature. The display device 100 may be configured such that its left and right sides are movable forward. For example, when an image is viewed from the front of the display device 100, the display device 100 may be curved concavely. In this case, the plate 120 may be curved with the same curvature as the display panel 110. Alternatively, the display panel 100 may be curved corresponding to the curvature of the plate 120.

Figure 2:
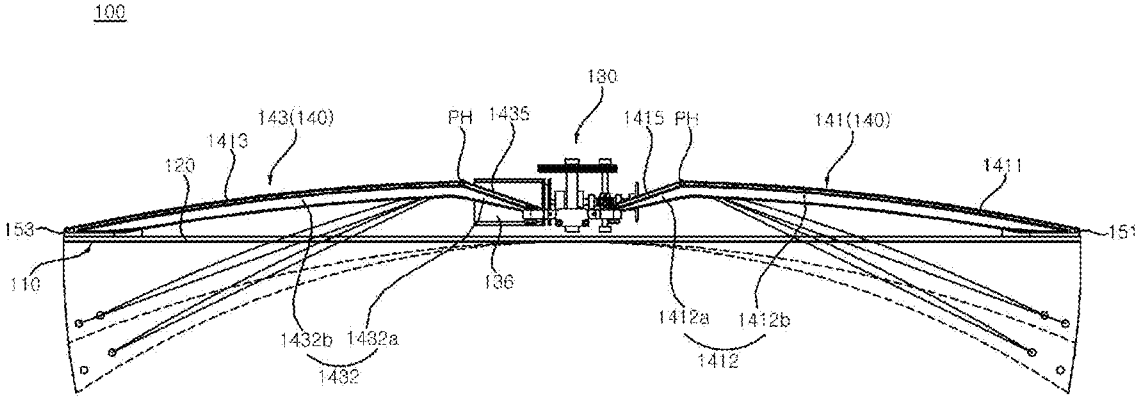
Figure 3:
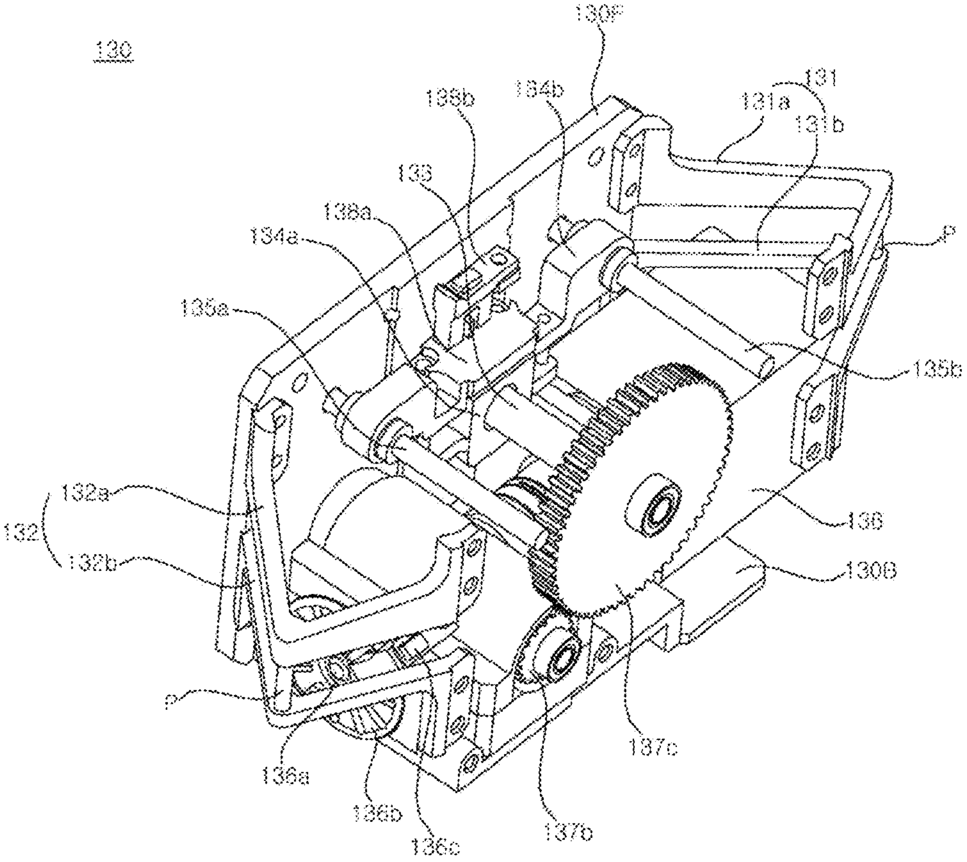

Referring to FIGS. 2 and 3, the plate 120 may be coupled to the rear of the display panel 110. The plate 120 may support the rear of the display panel 110. The plate 120 may have a shape corresponding to the display panel 110.

A driving or drive module 130 may be coupled to the rear of the plate 120. The drive module 130 may include a front bracket 130F, a base 130B, and wing brackets 131 and 132.

The front bracket 130F may be coupled or fixed to the rear or rear surface of the plate 120. The front bracket 130F may have a rectangular flat plate shape. The base 130B may be coupled or fixed to the front bracket 130F, and may define a bottom of the drive module 130.

A plurality of wing brackets 131 and 132 may be provided. The plurality of wing brackets 131 and 132 may include a first wing bracket 131 and a second wing bracket 132. The first wing bracket 131 may be coupled or fixed to the front bracket 130F, and may be disposed opposite the second wing bracket 132. The second wing bracket 132 may also be coupled or fixed to the front bracket 130F.

The wing bracket 131, 132 may have a V-shape. The wing bracket 131, 132 may be a pair of brackets 131 and 132. The wing bracket 131, 132 may include an upper bracket *131a*, *132a* and a lower bracket *131b*, *132b* that are positioned in parallel. A pin P may be positioned between the upper bracket *131a*, *132a* and the lower bracket *131b*, *132b*. The pin P may connect vertices of the upper bracket *131a*, *132a* and the lower bracket *131b*, *132b*.

A first wing 143 may be rotatably coupled to the first wing bracket 131, and a second wing 141 may be rotatably coupled to the second wing bracket 132. The first wing 143 and the second wing 141 may be line-symmetric with respect to the drive unit 130.

Figure 4:
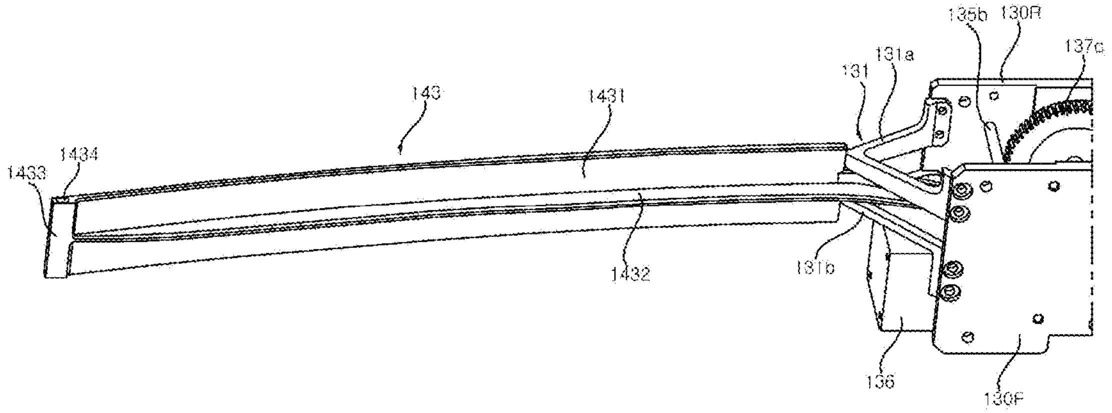
Figure 5:
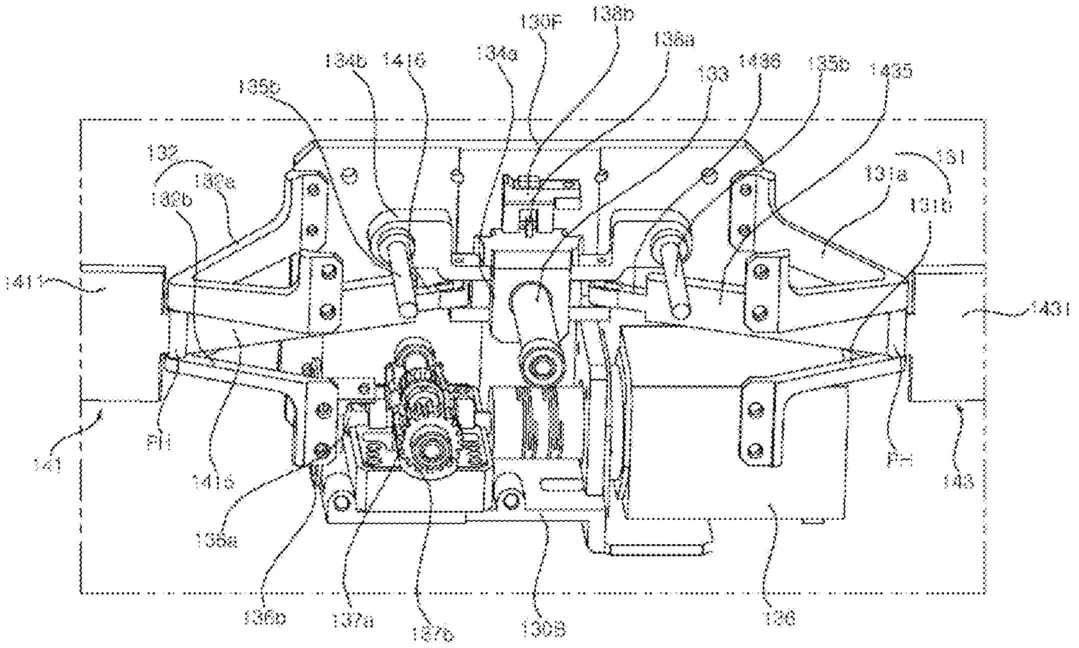

Referring to FIGS. 4 and 5, the first wing 143 may be pivotally connected to the first wing bracket 131. The description of the first wing 143 and the first wing bracket 131 may be equally applied to the second wing 141 and the second wing bracket 132. The first wing 143 may include a wing plate 1431, a rib 1432, a wing end 1433, a pivot shaft PH, and a lever 1435.

The wing plate 1431 may be an elongated plate. The lever 1435 may extend from one end of the wing plate 1431. The lever 1435 may be an elongated plate. A length of the lever 1435 may be less than a length of the wing plate 1431, and a width of the lever 1435 may be less than a width of the wing plate 1431. A thickness of the wing plate 1431 may be substantially equal to a thickness of the lever 1435.

Referring to FIGS. 4 and 5 along with FIG. 2, the rib 1412, 1432 may be elongated in a length (or longitudinal) direction of each of the wing plate 1411, 1431 and the lever 1415, 1435 to thereby be formed on one surface of each of the wing plate 1411, 1431 and the lever 1415, 1435. The rib 1412, 1432 may intersect a width direction of each of the wing plate 1411, 1431 and the lever 1415, 1435. The wing plate 1411, 1431 may be gently curved, and the lever 1415, 1435 may be connected to the wing plate 1411, 1431 while being bent. The rib 1412, 1432 may include a first rib **1412*a*, 1432*a* and a second rib 1412*b*, 1432*b*. The first rib 1412*a*, 1432*a* may have a width that gradually decreases with an increase in distance from the pivot shaft PH. The second rib 1412*b*, 1432*b* may have a width substantially the same as the width of the first rib 1412*a*, 1432*a*** adjacent to the pivot shaft PH.

As shown in FIG. 5, the pivot shaft PH of the wing 141, 143 may be pivotally connected to the pin P of the wing bracket 131, 132. The pin P may be inserted into the pivot shaft PH of the wing 141, 143. The wing 141, 143 may rotate or pivot about the pin P at the wing bracket 131, 132. A thickness of the pivot shaft PH may be greater than a thickness of the wing plate 1411, 1431 and/or a thickness of the lever 1415, 1435. Thus, it is possible to improve structural rigidity of the wing 140 during operation.

Figure 6:
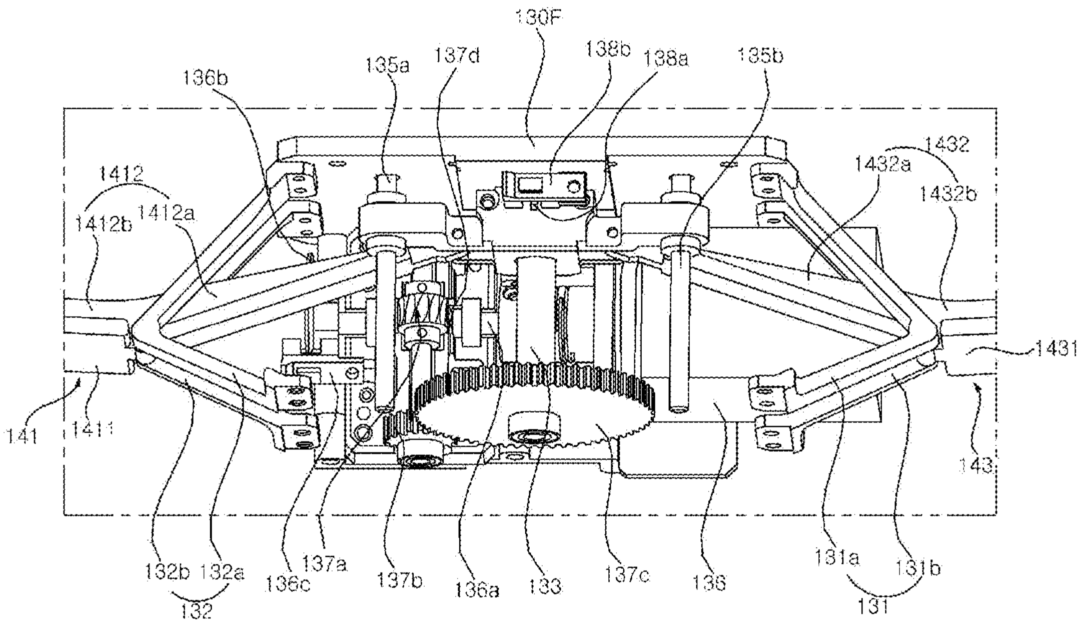

Referring to FIGS. 5 and 6, a lead screw 133 may be rotatably installed on the front bracket 130F. For example, the lead screw 133 may be elongated, and may have a screw thread on its outer surface. The lead screw 133 may be inserted into a slider **134*a*. The slider 134*a* may be thread-coupled with the lead screw 133. When the lead screw 133 is rotated, the slider 134*a* may reciprocate in a longitudinal direction of the lead screw 133**.

A slider guide **134*b* may be fixed on the slider 134*a*. The slider guide 134*b* may move together with the slider 134*a*. A guide shaft 135*a*, 135*b* may be coupled or fixed to the front bracket 130F. The guide shaft 135*a*, 135*b* may be parallel to the lead screw 134. The guide shaft 135*a*, 135*b* may include a first guide shaft 135*a* and a second guide shaft 135*b*. The first guide shaft 135*a* may be disposed opposite the second guide shaft 135*b* with respect to the lead screw 133. The guide shaft 135*a*, 135*b* may be inserted into the slider guide 134*b*. Accordingly, the slider 134*a* may stably reciprocate in the longitudinal direction of the lead screw 133 along with the rotation of the lead screw 133**.

A motor 136 may be mounted on the base 130B. A rotating shaft **136*a* of the motor 136 may intersect the longitudinal direction of the lead screw 133. The motor 136 and the rotating shaft 136*a* of the motor 136 may be disposed between the lead screw 133 and the base 130B. A worm 137*d* may be fixed to the rotating shaft 136*a* of the motor 136, and may rotate together with the rotating shaft 136*a* of the motor 136. A worm gear 137*a* may mesh with the worm 137*d*. A transmission gear 137*b* may rotate coaxially with the worm gear 137*a*. A driving gear 137*c* may be fixed to one end of the lead screw 133 so as to rotate together with the lead screw 133. The driving gear 137*c* may mesh with the transmission gear 137*b*. A diameter of the driving gear 137*c* may be greater than a diameter of the transmission gear 137*b***.

A disc indicator **136*b* may be fixed to be adjacent to an end of the rotating shaft 136*a* of the motor 136. A sensor 136*c* may be fixed to the base 130B or the wing bracket 132 while being adjacent to the disc indicator 136*b*. Accordingly, the number of rotations and/or the amount of rotation of the motor 136 may be detected. A pin indicator 138*a* may be fixed on the slider 134*a* or the slider guide 134*b*. A sensor 138*b* may be fixed to the front bracket 130F and may detect the approach of the pin indicator 138*a*, thereby detecting a start point and/or a terminal point of the slider 134*a***.

Figure 7:
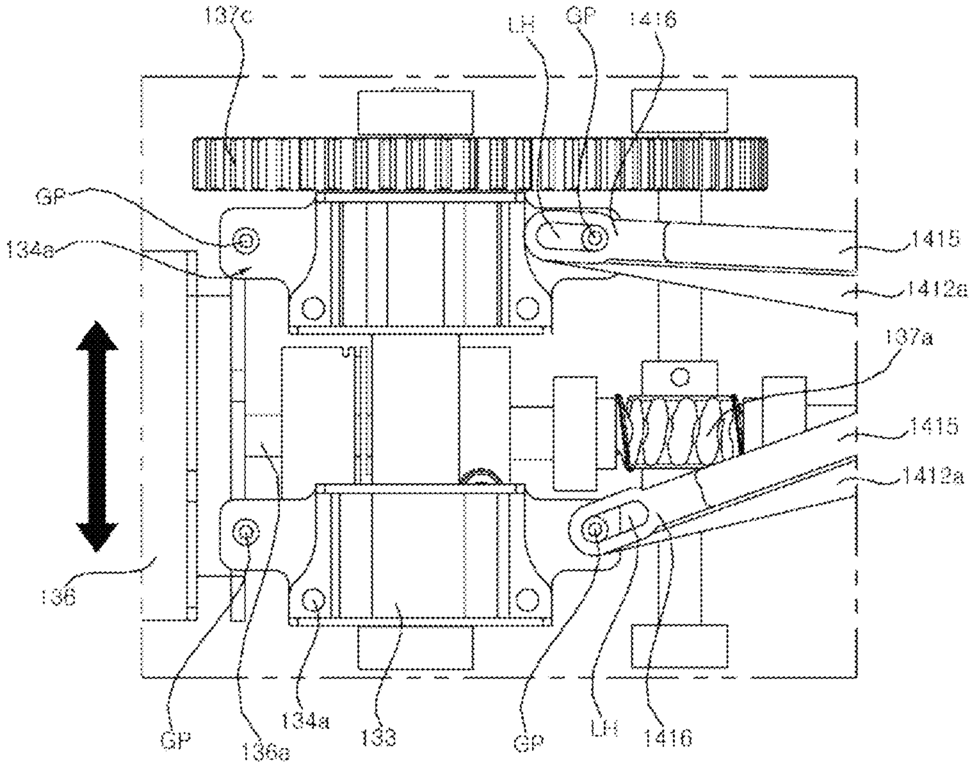
Figure 8:
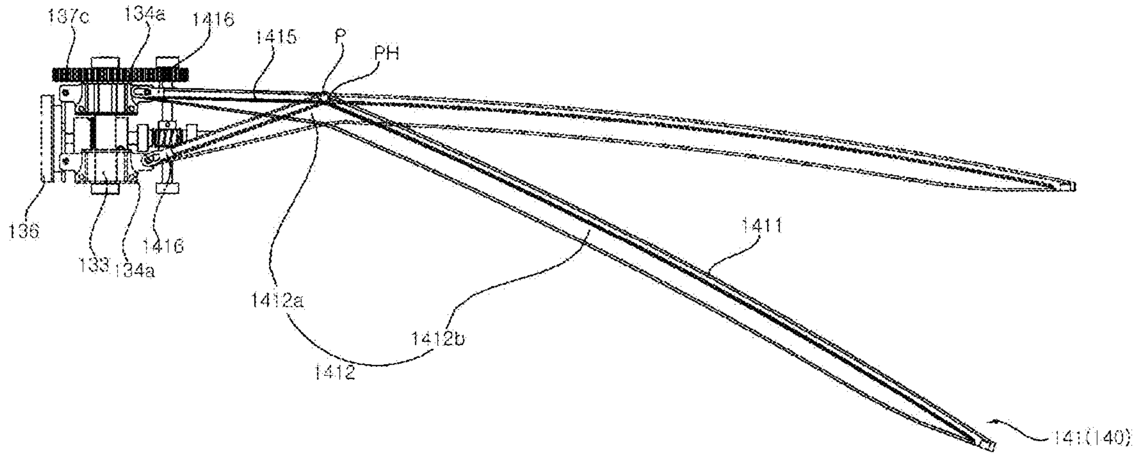

Referring to FIGS. 7 and 8, the wing 141 may include a connecting rod 1416. The connecting rod 1416 may be fixed to the lever 1415 or may extend from the lever 1415. The connecting rod 1416 may be connected to the slider **134*a*. The connecting rod 1416 may be pivotally connected to the slider 134*a*. The connecting rod 1416 may have a long hole LH. The long hole LH may be formed at an end of the connecting rod 1416 that is adjacent to the slider 134*a*. The slider 134*a*** may have a connecting pin GP. The connecting pin GP may have a cylindrical shape. A diameter of the connecting pin GP may be substantially equal to a width of the long hole LH.

As the lead screw 133 rotates, the slider **134*a* may reciprocate in the longitudinal direction of the lead screw 133. The lever 1415 that is connected to the slider 134*a* by the connecting rod 1416 may move together with the slider 134*a*, and the wing 141** may pivot about the pivot shaft PH. In this case, the connecting pin GP may move within the long hole LH.

Figure 9:
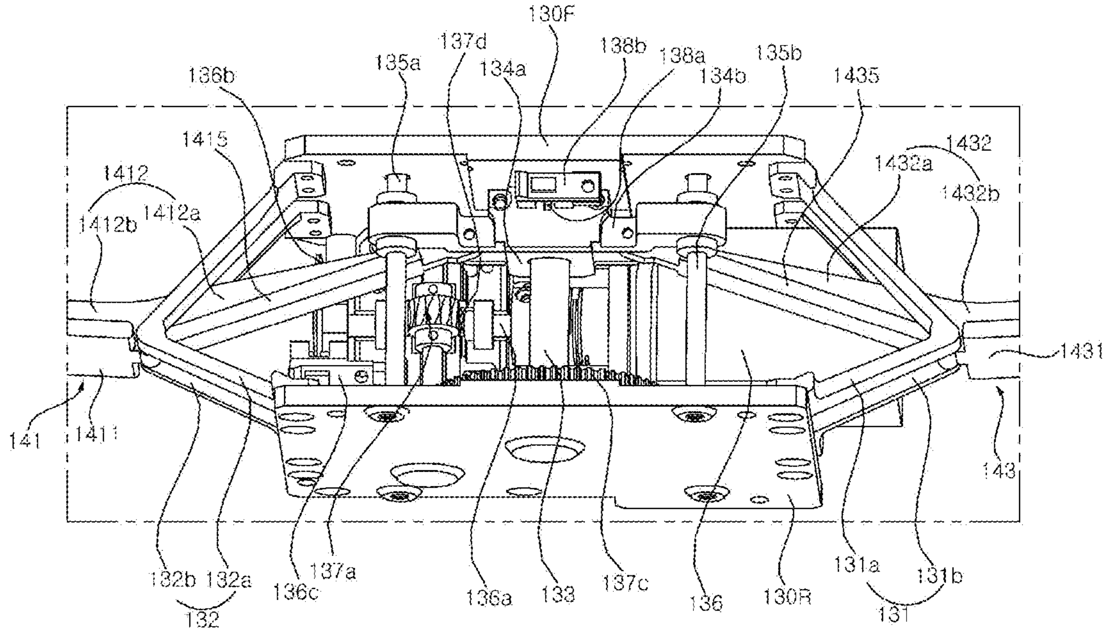

Referring to FIG. 9, a rear bracket 130R may be coupled to the wing brackets 131 and 132. The rear bracket 130R may be disposed opposite the front bracket 130F. The lead screw 133 may connect the front bracket 130F and the rear bracket 130R.

The guide shaft **135*a*, 135*b* may be coupled to the front bracket 130F and the rear bracket 130R. A length of the lead screw 133 and/or a length of the guide shaft 135*a*, 135*b* may correspond to a distance between the front bracket 130F and the rear bracket 130**R.

The wing brackets 131 and 132 may be coupled to the front bracket 130F and the rear bracket 130R. A first end of the wing bracket 131, 132 may be coupled or fixed to the front bracket 130F, and a second end of the wing bracket 131, 132 may be coupled to the rear bracket 130R.

Figure 10:
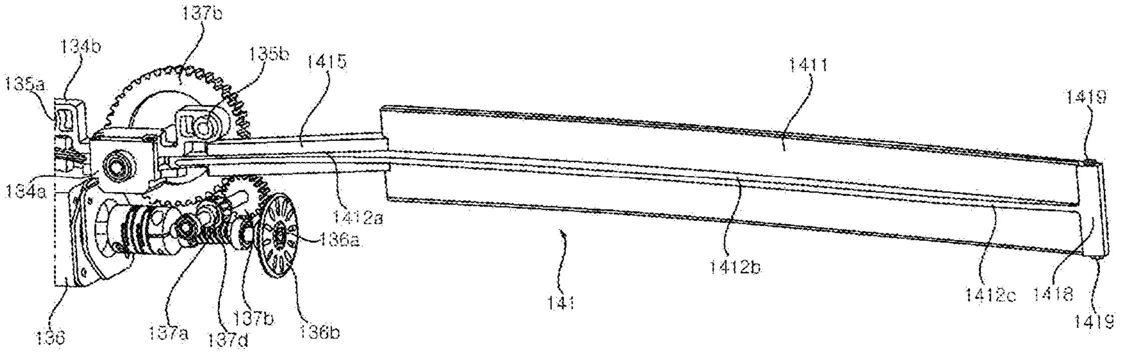
Figure 11:
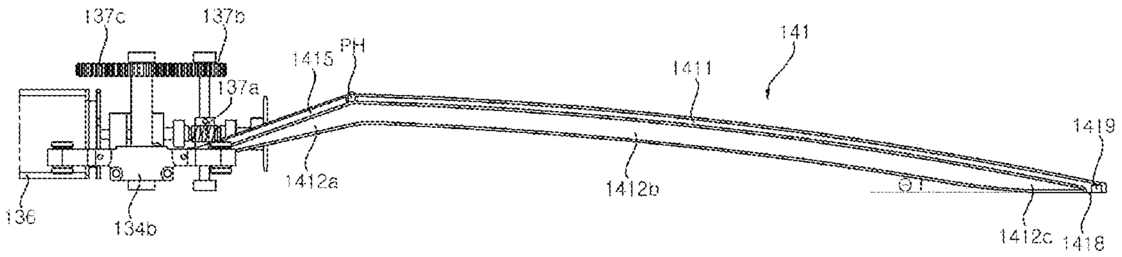

Referring to FIGS. 10 and 11, the wing 141 may include a wing end 1418 and an end rib **1412*c*. The wing end 1418 may define an end of the wing plate 1411. A thickness of the wing end 1418 may be greater than a thickness of the wing plate 1411**.

The end rib **1412*c* may be referred to as a third rib 1412*c*. The third rib 1412*c* may connect the wing end 1418 from the second rib 1412*b*. The third rib 1412*c* may extend in a longitudinal direction of the second rib 1412*b*, and may be formed on the wing plate 1411**.

A longitudinal direction of the third rib **1412*c* may form a predetermined angle with respect to the longitudinal direction of the second rib 1412*b*. For example, the longitudinal direction of the second rib 1412*b* may form an obtuse angle with respect to the longitudinal direction of the third rib 1412*c***.

An end pin 1419 may be formed at the wing end 1418. The end pin 1419 may protrude from a first end surface and/or a second end surface of the wing end 1418.

Figure 12:
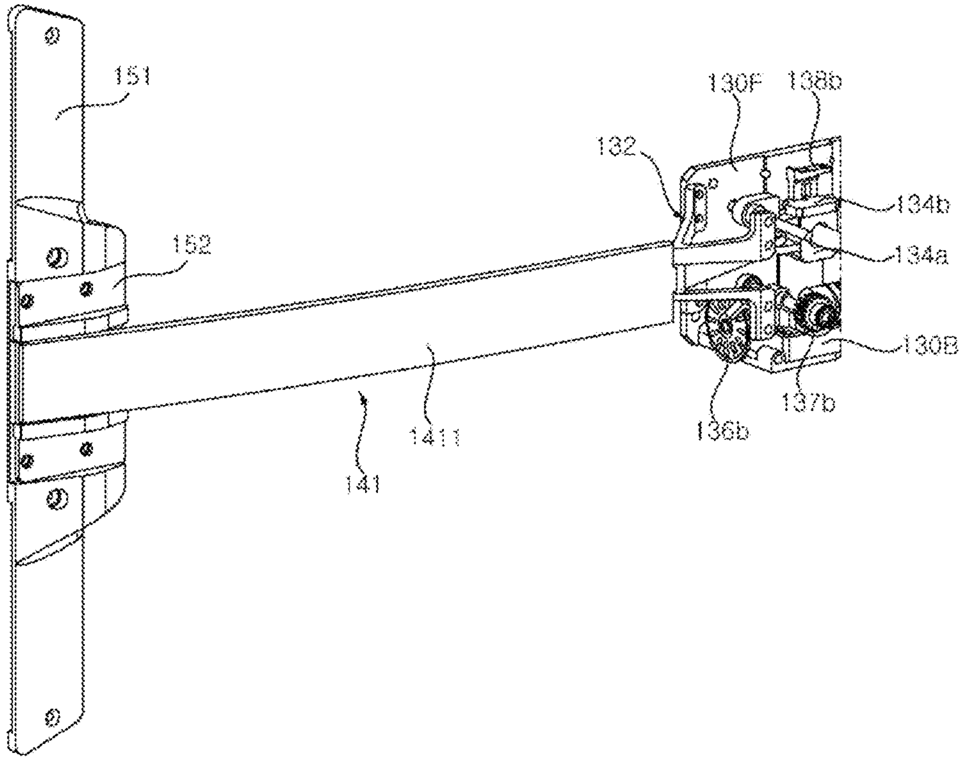
Figure 13:
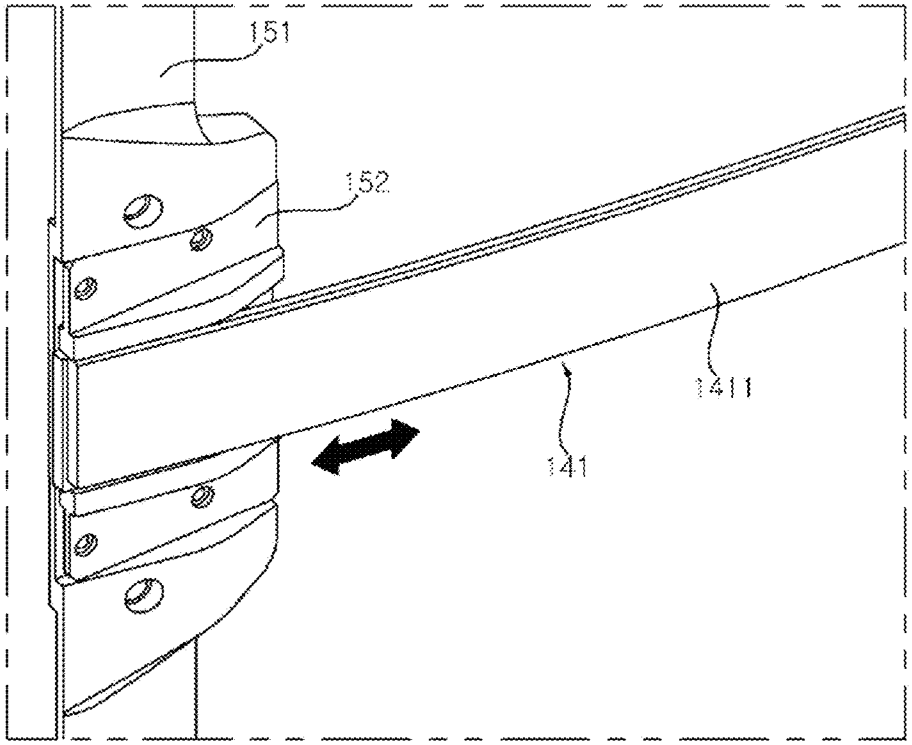
Figure 14:
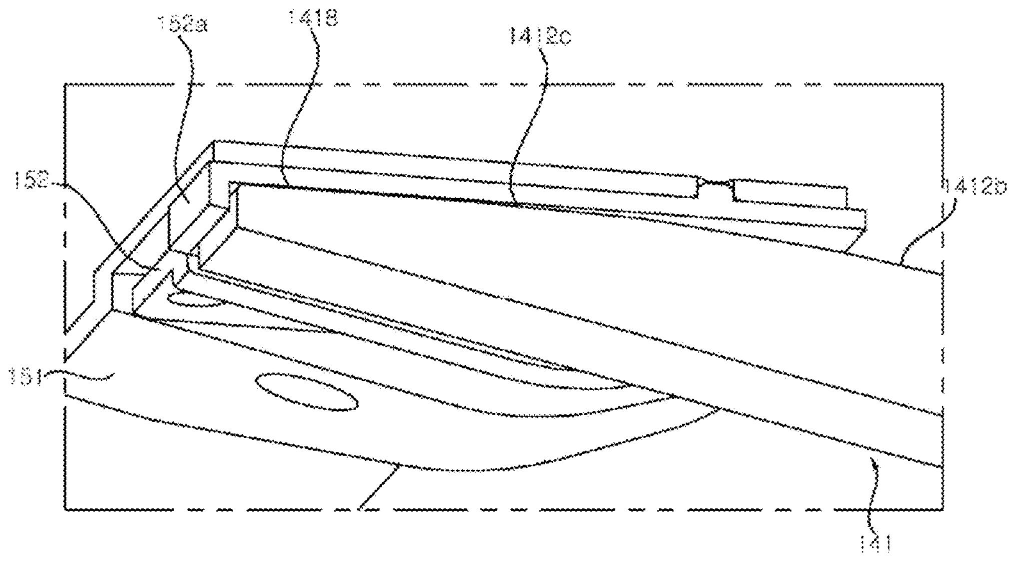

Referring to FIGS. 12 to 14, a side frame 151, 153 (see FIG. 2) may be coupled or fixed to the rear or rear surface of the plate 120. The side frame 151 may include a sliding mount 152. The sliding mount 152 may be mounted or fixed on the side frame 151.

The wing 141 may be coupled to the sliding mount 152 to be movable on the sliding mount 152. As the wing 141 moves on the sliding mount 152, the third rib 1412*c* and the wing end 1418 may come into contact with the sliding mount 152. As the third rib 1412*c* and the wing end 1418 come into contact with the sliding mount 152, a bending force applied by the wing 141 to the plate 120 may be effectively transmitted.

The sliding mount 152 may include a stopper 152*a* formed by bending its end. When the plate 120 remains flat, the wing end 1418 may contact the stopper 152*a* of the sliding mount 152. Accordingly, both ends of the plate 120 may be directed toward the rear of the display device 100, thereby preventing the front surface of the display panel 110 from being convexly curved.

Figure 15:
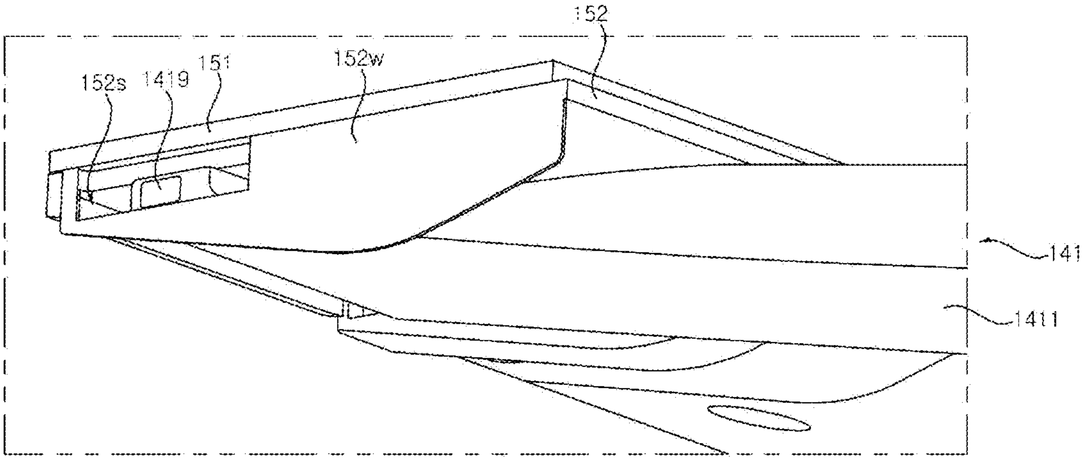
Figure 16:
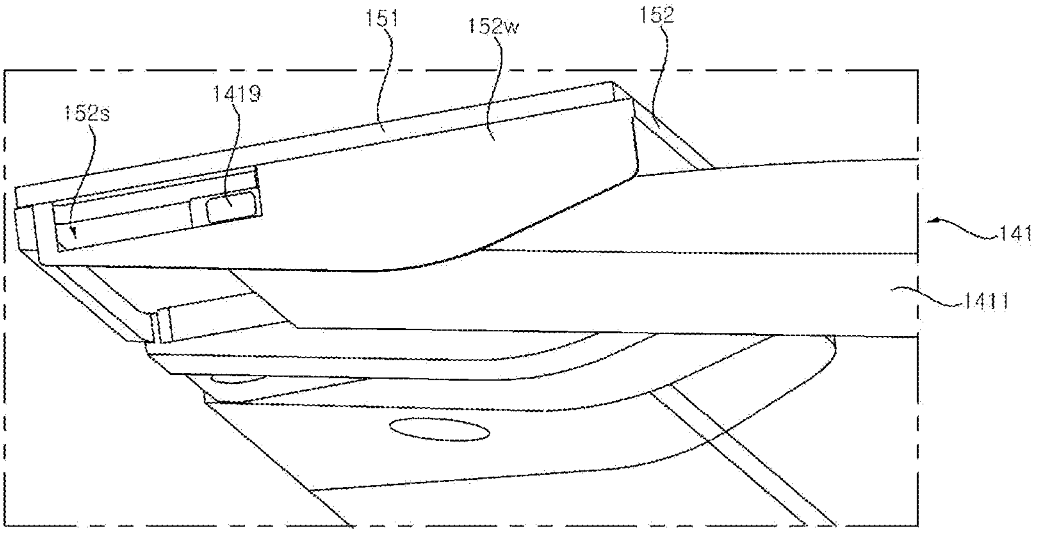

Referring to FIGS. 15 and 16, the sliding mount 152 may include a side wall 152W. The side wall 152W may face a side surface of the wing plate 1411. The wing plate 1411 may come into contact with the side wall 152W while moving on the sliding mount 152. The side wall 152W may guide the movement of the wing plate 1411.

A guide slot 152S may be formed in the side wall 152W. The guide slot 152S may be formed through the side wall 152W in a longitudinal direction of the wing plate 1411 so as to be elongated. For example, the guide slot 152S may be of a rectangular shape.

The end pin 1419 may be inserted into the guide slot 152S. The end pin 1419 may move in the guide slot 152S. Together with the guide slot 152S, the end pin 1419 may limit the movement of the wing plate 1411. For example, the end pin 1419 may have a rectangular cross-section.

Accordingly, the force transmitted by the wing plate 1411 to the side frame 151 may be maintained constant. In addition, while the display panel 110 and the plate 120 are curved, flattening of portions adjacent to both ends of the display panel 110 and the plate 120 may be suppressed or reduced.

Figure 17:
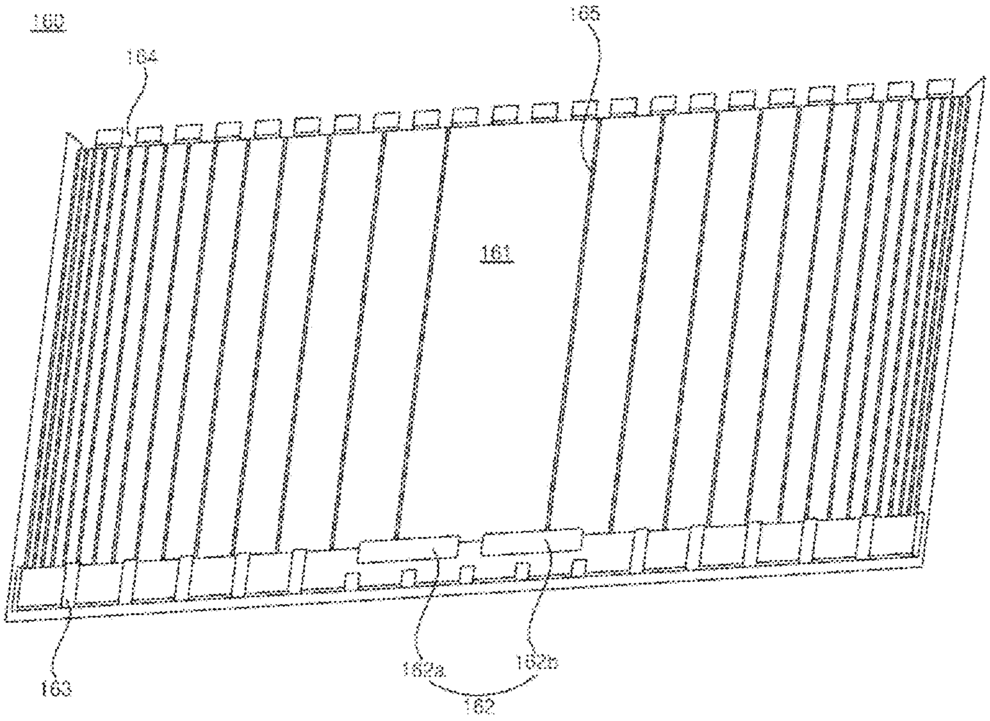
Figure 18:
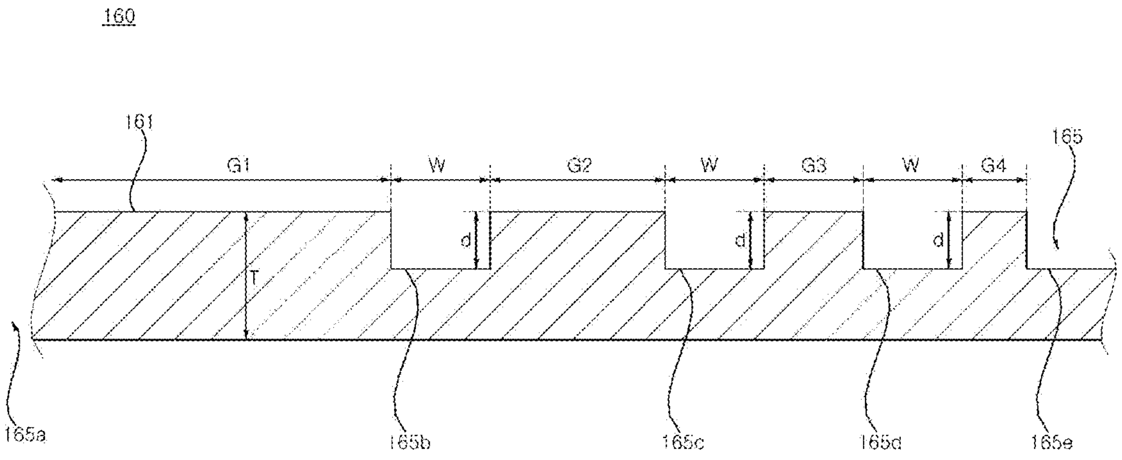

Referring to FIGS. 17 and 18, an inner plate 160 may be positioned between the display panel 110 (see FIG. 2) and the plate 120. A cutting line 165 may be formed on a front surface of a flat portion 161 of the inner plate 160. For example, the cutting line 165 may form a rectangular cross-section in a left-and-right direction of the inner plate 160.

The cutting line 165 may be formed by etching or cutting out the front surface of the flat portion 161 of the inner plate 160 in an up-and-down direction of the inner plate 160. For example, a thickness T of the flat portion 161 of the inner plate 160 may be about 1.3 to 1.7 times a depth d of the cutting line 165.

A plurality of cutting lines 165 may be elongated in the up-and-down direction of the inner plate 160. The plurality of cutting lines 165 may have the same width W. The plurality of cutting lines 165 may be arranged such that gaps or distances between adjacent cutting lines 165 are different from each other. A first gap G1 between a first cutting line 165*a* closest to a center of the inner plate 160 and a second cutting line 165*b* adjacent to the first cutting line 165*a* may be greater than a second gap G2 between the second cutting line 165*b* and a third cutting line 165*c* adjacent to the second cutting line 165*b*. A third gap G3 between the third cutting line 165*c* and a fourth cutting line 165*d* adjacent to the third cutting line 165*c* may be greater than a fourth gap G4 between the fourth cutting line 165*d* and a fifth cutting line 165*e* adjacent to the fourth cutting line 165*d*. The second gap G2 may be greater than the third gap G3. The gaps between the plurality of cutting lines 165 may be gradually reduced from the center to the side of the inner plate 160. Accordingly, while the display device is curved, the degree of curvature matching may be improved. For example, the curvature may be 800 R or 1000 R.

A cable hole 162 may be formed through the flat portion 161 of the inner plate 160 so as to be formed in the flat portion 161 of the inner plate 160. The cable hole 162 may be elongated horizontally. The cable hole 162 may be formed adjacent to a lower side of the inner plate 160. A plurality of cable holes 162 may be positioned adjacent to the center of the inner plate 160 while being adjacent to each other.

A plurality of receiving holes 163 may be formed through the inner plate 160 along the lower side of the inner plate 160. For example, a source PCB of the display panel 110 may be accommodated and positioned in the receiving hole 163.

A cut-out (or cutout) 164 may be formed on an upper side of the flat portion 161 of the inner plate 160. A plurality of cut-outs 164 may be provided, and the plurality of cut-outs 164 may be spaced at regular intervals along the upper side of the flat portion 161 of the inner plate 160.

Figure 19:
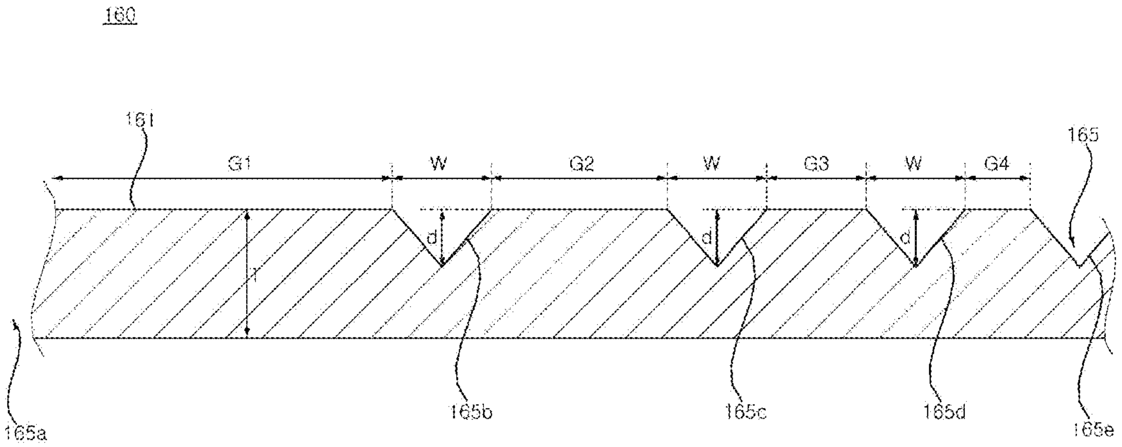

Referring to FIG. 19, a cutting line 165 may be formed on a front surface of a flat portion 161 of the inner plate 160. For example, the cutting line 165 may form a triangular cross-section in a left-and-right direction of the inner plate 160.

The cutting line 165 may be formed by etching or cutting out the front surface of the flat portion 161 of the inner plate 160 in an up-and-down direction of the inner plate 160. For example, a thickness T of the flat portion 161 of the inner plate 160 may be about 1.3 to 1.7 times a depth d of the cutting line 165.

A plurality of cutting lines 165 may be elongated in the up-and-down direction of the inner plate 160. The plurality of cutting lines 165 may have the same width W. The plurality of cutting lines 165 may be arranged such that gaps or distances between adjacent cutting lines 165 are different from each other. A first gap G1 between a first cutting line 165*a* closest to a center of the inner plate 160 and a second cutting line 165*b* adjacent to the first cutting line 165*a* may be greater than a second gap G2 between the second cutting line 165*b* and a third cutting line 165*c* adjacent to the second cutting line 165*b*. A third gap G3 between the third cutting line 165*c* and a fourth cutting line 165*d* adjacent to the third cutting line 165*c* may be greater than a fourth gap G4 between the fourth cutting line 165*d* and a fifth cutting line 165*e* adjacent to the fourth cutting line 165*d*. The second gap G2 may be greater than the third gap G3. The gaps between the plurality of cutting lines 165 may be gradually reduced from the center to the side of the inner plate 160.

Accordingly, while the display device is curved, the degree of curvature matching may be improved. For example, the curvature may be 800 R or 1000 R.

Figure 20:
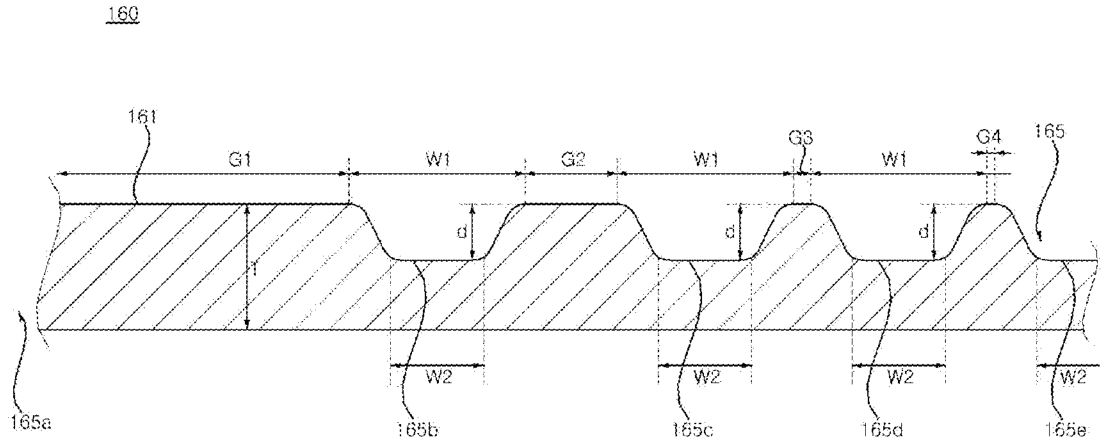

Referring to FIG. 20, a cutting line 165 may be formed on a front surface of a flat portion 161 of the inner plate 160. For example, the cutting line 165 may form a trapezoidal cross-section in a left-and-right direction of the inner plate 160.

The cutting line 165 may be formed by etching or cutting out the front surface of the flat portion 161 of the inner plate 160 in an up-and-down direction of the inner plate 160. For example, a thickness T of the flat portion 161 of the inner plate 160 may be about 1.3 to 1.7 times a depth d of the cutting line 165.

A plurality of cutting lines 165 may be elongated in the up-and-down direction of the inner plate 160. The plurality of cutting lines 165 may have the same width W1, W2. A first width W1 of the top of the cutting line 165 may be greater than a second width W2 of the bottom of the cutting line 165. A top edge of the cutting line 165 may be rounded, and a bottom edge of the cutting line 165 may be rounded. The top edge of the cutting line 165 may be an embossed edge, and the bottom edge of the cutting line 165 may be an engraved edge.

The plurality of cutting lines 165 may be arranged such that gaps or distances between adjacent cutting lines 165 are different from each other. A first gap G1 between a first cutting line 165*a* closest to a center of the inner plate 160 and a second cutting line 165*b* adjacent to the first cutting line 165*a* may be greater than a second gap G2 between the second cutting line 165*b* and a third cutting line 165*c* adjacent to the second cutting line 165*b*. A third gap G3 between the third cutting line 165*c* and a fourth cutting line 165*d* adjacent to the third cutting line 165*c* may be greater than a fourth gap G4 between the fourth cutting line 165*d* and a fifth cutting line 165*e* adjacent to the fourth cutting line 165*d*. The second gap G2 may be greater than the third gap G3. The gaps between the plurality of cutting lines 165 may be gradually reduced from the center to the side of the inner plate 160.

Accordingly, while the display device is curved, the degree of curvature matching may be improved. For example, the curvature may be 800 R or 1000 R.

Figure 21:
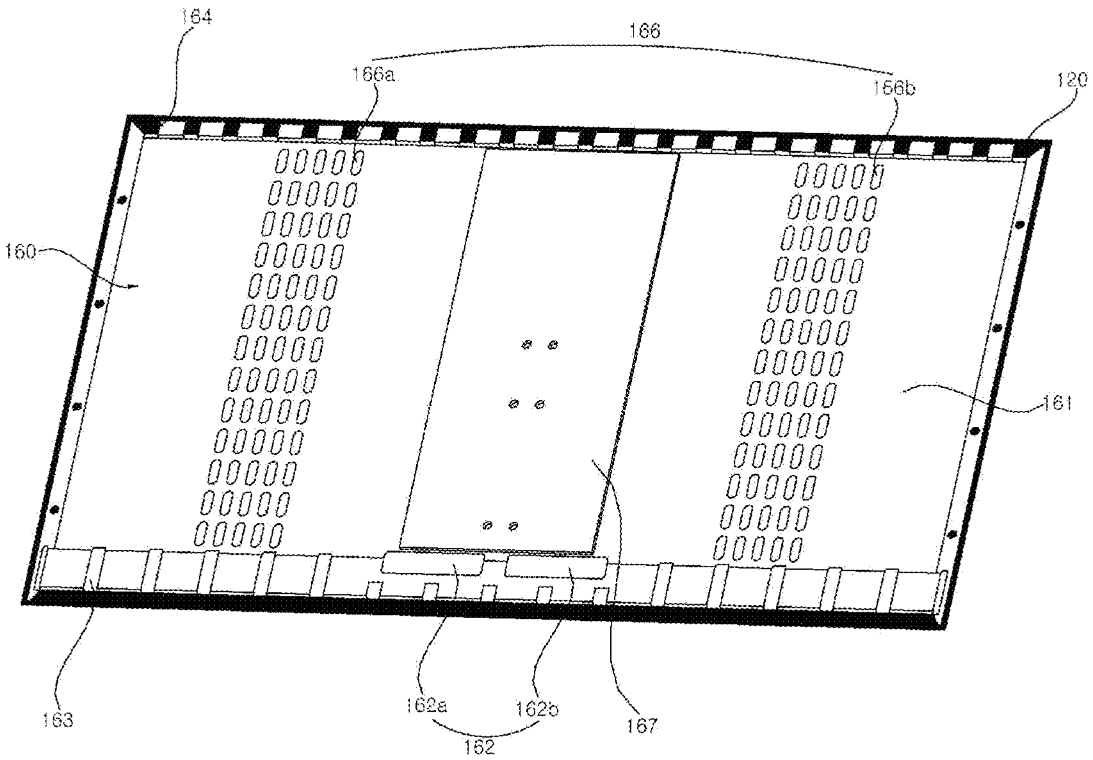

Referring to FIG. 21, an inner plate 160 may be positioned between the plate 120 and the display panel 110 (see FIG. 2). The inner plate 160 may be coupled or fixed to the plate 120.

A center plate 167 may be coupled or fixed on the inner plate 160. The center plate 167 may be a plate elongated vertically. The center plate 167 may reinforce the rigidity of the inner plate 160.

A cable hole 162 may be formed through a flat portion 161 of the inner plate 160 so as to be formed in the flat portion 161 of the inner plate 160. The cable hole 162 may be elongated horizontally. The cable hole 162 may be formed adjacent to a lower side of the inner plate 160. A plurality of cable holes 162 may be positioned adjacent to a center of the inner plate 160 while being adjacent to each other.

A width of the center plate 167 may correspond to lengths of the cable holes 162. A distance between both ends in a width direction of the center plate 167 may be less than a distance between respective ends of the cable holes 162.

A plurality of receiving holes 163 may be formed through the inner plate 160 along the lower side of the inner plate 160. For example, a source PCB of the display panel 110 may be accommodated and positioned in the receiving hole 163.

A punching hole 166 may be formed in the flat portion 161 of the inner plate 160. The punching hole 166 may be provided in plurality. The plurality of punching holes 166 may include a first plurality of punching holes 166*a* and a second plurality of punching holes 166*b*. The punching hole 166 may be a long hole elongated vertically.

The first plurality of punching holes 166*a* may be positioned between the center plate 167 and a left side of the inner plate 160. The second plurality of punching holes 166*b* may be positioned between the center plate 167 and a right side of the inner plate 160. For example, the punching holes 166 may form 5 columns. As another example, the punching holes 166 may form 13 rows.

The first plurality of punching holes 166*a* may be closer to the center plate 167 than the left side of the inner plate 160. The second plurality of punching holes 166*b* may be closer to the center plate 167 than the right side of the inner plate 160.

A cut-out 164 may be formed on an upper side of the flat portion 161 of the inner plate 160. A plurality of cut-outs 164 may be provided, and the plurality of cut-outs 164 may be spaced at regular intervals along the upper side of the flat portion 161 of the inner plate 160.

Accordingly, while the display device is curved, the degree of curvature matching may be improved. For example, the curvature may be 800 R or 1000 R.

Figure 22:
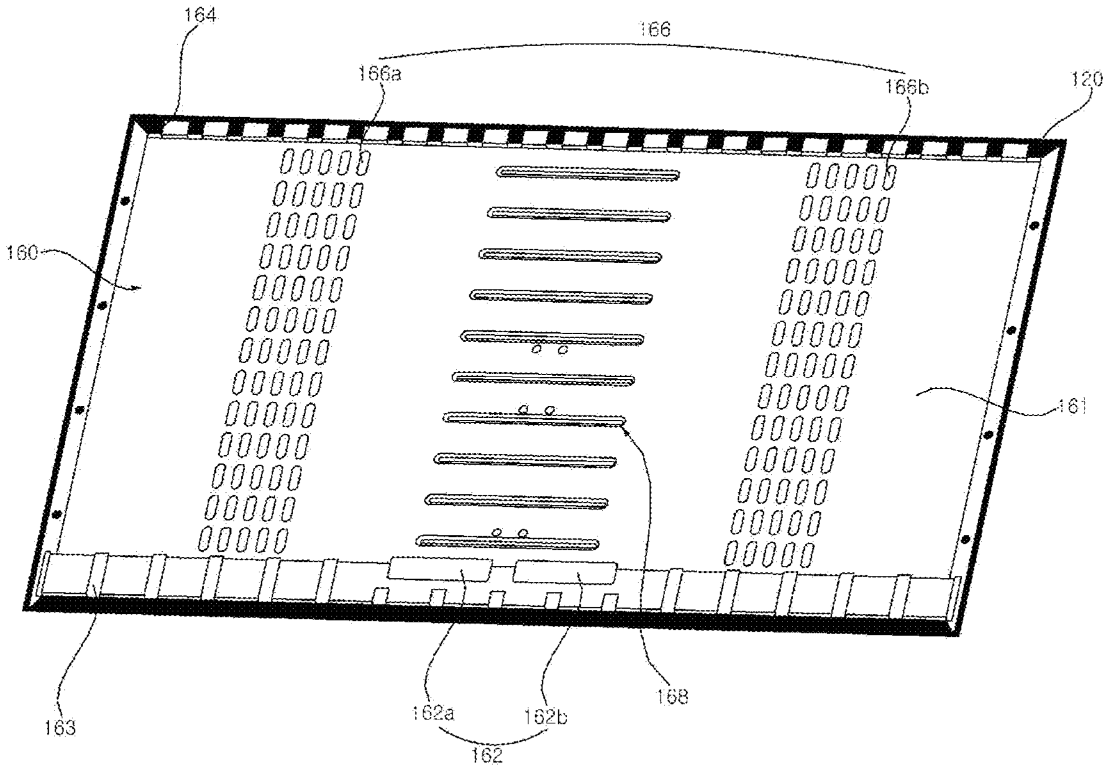
Figure 23:
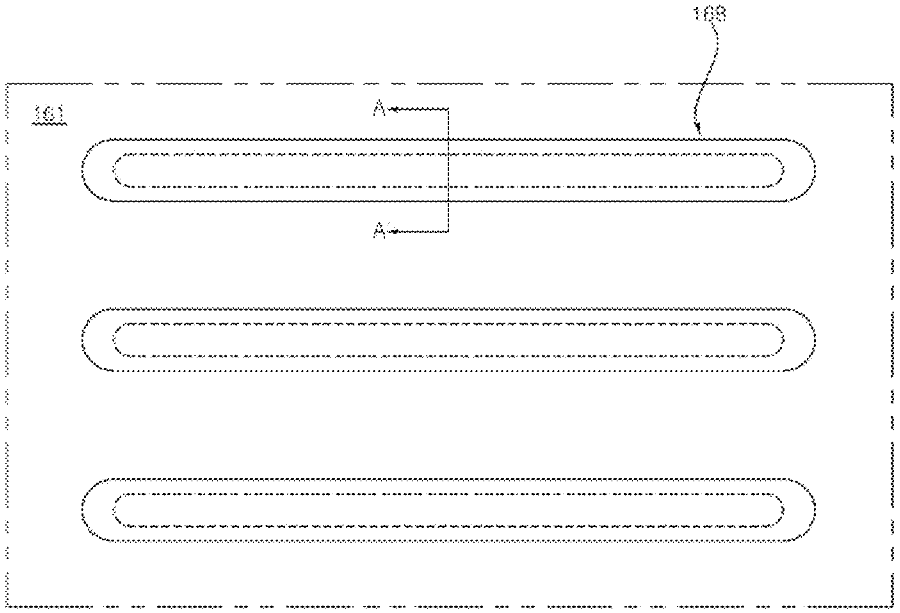
Figure 24:
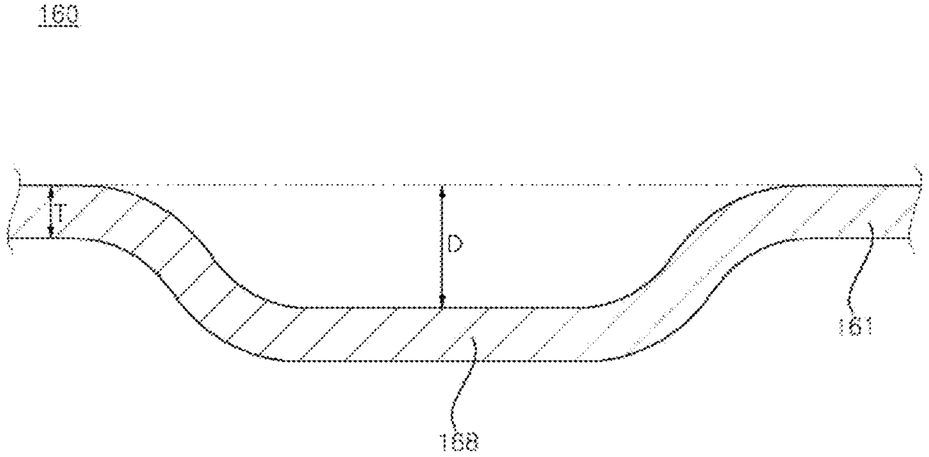

Referring to FIGS. 22 to 24, an inner plate 160 may be positioned between the plate 120 and the display panel 110 (see FIG. 2). The inner plate 160 may be coupled or fixed to the plate 120.

A pressed part 168 may be elongated horizontally. The pressed part 168 may be formed by a flat portion 161 of the inner plate 160 being pressed and depressed. The pressed parts 168 may be sequentially arranged to be spaced apart from each other in an up-and-down direction of the inner plate 160. The pressed part 168 may not only reinforce the rigidity of the inner plate 160 but also maintain the flexibility of the inner plate 160.

A cable hole 162 may be formed through the flat portion 161 of the inner plate 160 so as to be formed in the flat portion 161 of the inner plate 160. The cable hole 162 may be elongated horizontally. The cable hole 162 may be formed adjacent to a lower side of the inner plate 160. A plurality of cable holes 162 may be positioned adjacent to a center of the inner plate 160 while being adjacent to each other.

A length of the pressed part 168 may correspond to lengths of the cable holes 162. The length of the pressed part 168 may be less than a distance between respective ends of the cable holes 162.

A plurality of receiving holes 163 may be formed through the inner plate 160 along the lower side of the inner plate 160. For example, a source PCB of the display panel 110 may be accommodated and positioned in the receiving hole 163.

A punching hole 166 may be formed in the flat portion 161 of the inner plate 160. The punching hole 166 may be provided in plurality. The plurality of punching holes 166 may include a first plurality of punching holes 166*a* and a second plurality of punching holes 166*b*. The punching hole 166 may be a long hole elongated vertically.

The first plurality of punching holes 166*a* may be positioned between the pressed part 168 and a left side of the inner plate 160. The second plurality of punching holes 166*b* may be positioned between the pressed part 168 and a right side of the inner plate 160. For example, the punching holes 166 may form 5 columns. As another example, the punching holes 166 may form 13 rows.

The first plurality of punching holes 166*a* may be closer to the pressed part 168 than the left side of the inner plate 160. The second plurality of punching holes 166*b* may be closer to the pressed part 168 than the right side of the inner plate 160.

A cut-out 164 may be formed on an upper side of the flat portion 161 of the inner plate 160. A plurality of cut-outs 164 may be provided, and the plurality of cut-outs 164 may be spaced at regular intervals along the upper side of the flat portion 161 of the inner plate 160.

A depth D of the pressed part 168 may be 1.3 to 1.5 times a thickness of the flat portion 161 of the inner plate 160. The pressed part 168 may not only reinforce the rigidity of the inner plate 160 but also maintain the flexibility of the inner plate 160.

Accordingly, while the display device is curved, the degree of curvature matching may be improved. For example, the curvature may be 800 R or 1000 R.

Figure 25:
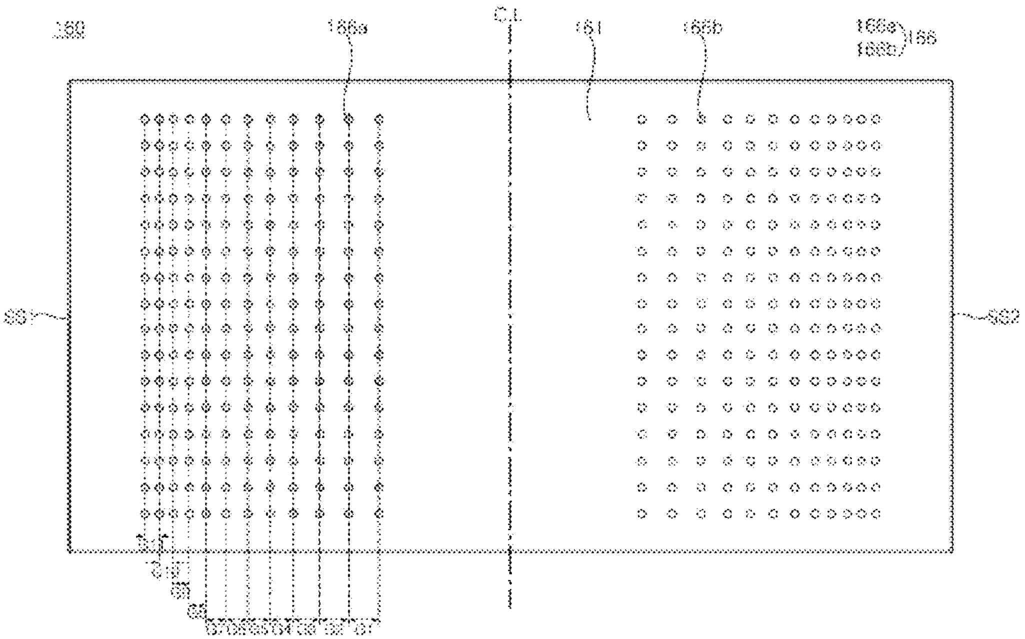

Referring to FIG. 25, an inner plate 160 may be positioned between the plate 120 (see FIG. 2) and the display panel 110 (see FIG. 2). The inner plate 160 may be coupled or fixed to the plate 120.

A punching hole 166 may be formed in a flat portion 161 of the inner plate 160. The punching hole 166 may be provided in plurality. The plurality of punching holes 166 may include a first plurality of punching holes 166*a* and a second plurality of punching holes 166*b*. The punching hole 166 may be a circular hole.

The first plurality of punching holes 166*a* may be positioned between a center line CL and a left side SS1 of the inner plate 160. The second plurality of punching holes 166*b* may be positioned between the center line CL and a right side SS2 of the inner plate 160. For example, the punching holes 166 may form 12 columns. As another example, the punching holes 166 may form 16 rows.

The first plurality of punching holes 166*a* may be closer to the left side SS1 of the inner plate 160 than the center line CL. The second plurality of punching holes 166*b* may be closer to the right side SS2 of the inner plate 160 than the center line CL.

The first plurality of punching holes 166*a* may include a first column, a second column, a third column, a fourth column, a fifth column, a sixth column, a seventh column, an eighth column, a ninth column, a tenth column, an eleventh column, and a twelfth column.

For example, a first gap G1 between the first column and the second column may be greater than a second gap G2 between the second column and the third column. For example, the second gap G2 between the second column and the third column may be greater than a third gap G3 between the third column and the fourth column. For example, the third gap G3 between the third column and the fourth column may be greater than a fourth gap G4 between the fourth column and the fifth column. For example, the fourth gap G4 between the fourth column and the fifth column may be greater than a fifth gap G5 between the fifth column and the sixth column. For example, the fifth gap G5 between the fifth column and the sixth column may be greater than a sixth gap G6 between the sixth column and the seventh column. For example, the sixth gap G6 between the sixth column and the seventh column may be greater than a seventh gap G7 between the seventh column and the eighth column. For example, the seventh gap G7 between the seventh column and the eighth column may be greater than an eighth gap G8 between the eighth column and the ninth column. For example, the eighth gap G8 between the eighth column and the ninth column may be greater than a ninth gap G9 between the ninth column and the tenth column. For example, the ninth gap G9 between the ninth column and the tenth column may be greater than a tenth gap G10 between the tenth column and the eleventh column. For example, the tenth gap G10 between the tenth column and the eleventh column may be greater than an eleventh gap G11 between the eleventh column and the twelfth column.

Accordingly, while the display device is curved, the degree of curvature matching may be improved. For example, the curvature may be 800 R or 1000 R.

Figure 26:
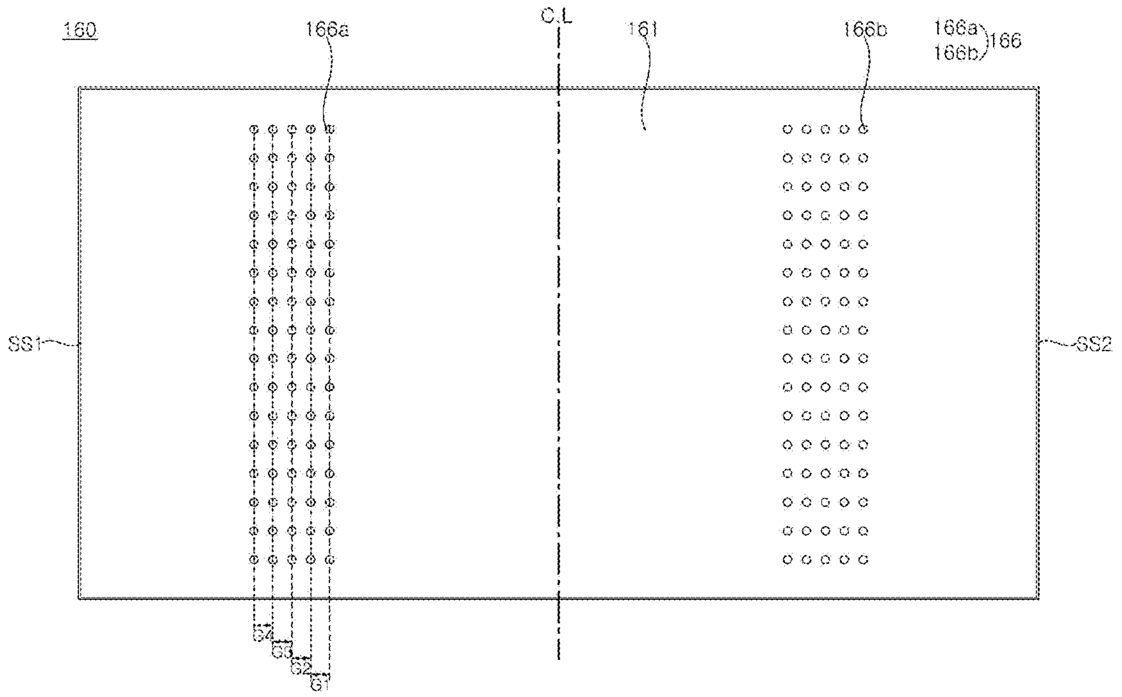

Referring to FIG. 26, an inner plate 160 may be positioned between the plate 120 (see FIG. 2) and the display panel 110 (see FIG. 2). The inner plate 160 may be coupled or fixed to the plate 120.

A punching hole 166 may be formed in a flat portion 161 of the inner plate 160. The punching hole 166 may be provided in plurality. The plurality of punching holes 166 may include a first plurality of punching holes 166*a* and a second plurality of punching holes 166*b*. The punching hole 166 may be a circular hole.

The first plurality of punching holes 166*a* may be positioned between a center line CL and a left side SS1 of the inner plate 160. The second plurality of punching holes 166*b* may be positioned between the center line CL and a right side SS2 of the inner plate 160. For example, the punching holes 166 may form 5 columns. As another example, the punching holes 166 may form 16 rows.

The first plurality of punching holes 166*a* may be closer to the left side SS1 of the inner plate 160 than the center line CL. The second plurality of punching holes 166*b* may be closer to the right side SS2 of the inner plate 160 than the center line CL.

The first plurality of punching holes 166*a* may include a first column, a second column, a third column, a fourth column, and a fifth column.

For example, a first gap G1 between the first column and the second column may be substantially equal to a second gap G2 between the second column and the third column. For example, the second gap G2 between the second column and the third column may be substantially equal to a third gap G3 between the third column and the fourth column. For example, the third gap G3 between the third column and the fourth column may be substantially equal to a fourth gap G4 between the fourth column and the fifth column.

Accordingly, while the display device is curved, the degree of curvature matching may be improved. For example, the curvature may be 800 R or 1000 R.

Figure 27:
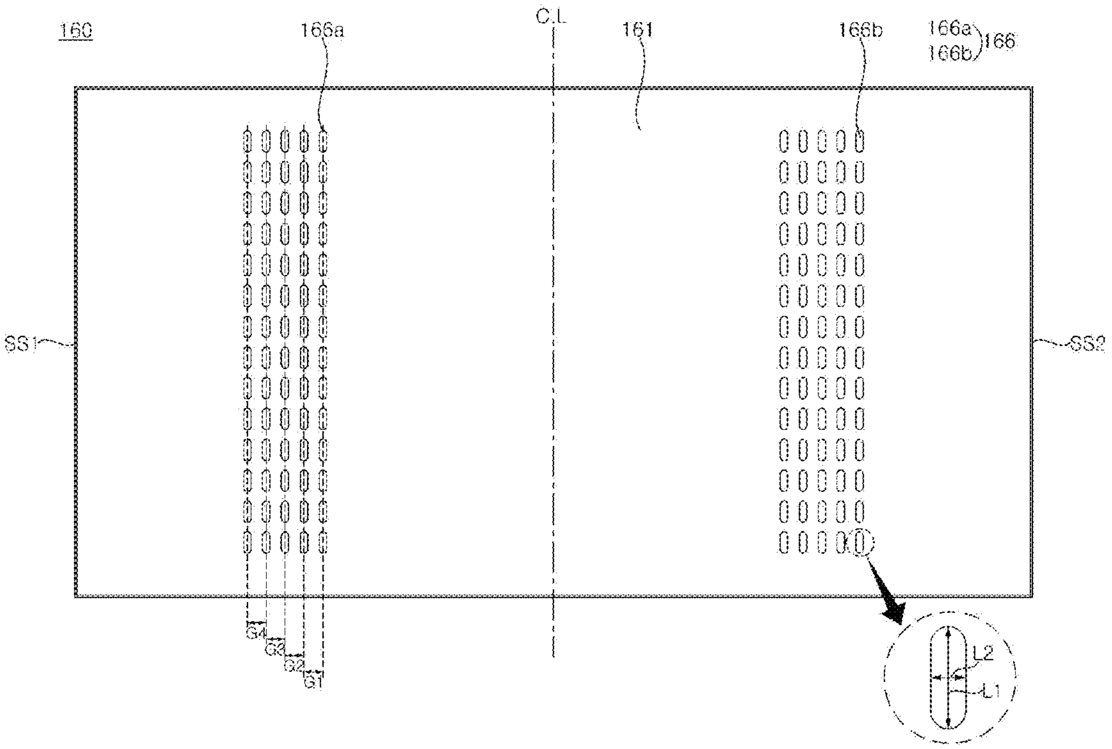

Referring to FIG. 27, an inner plate 160 may be positioned between the plate 120 (see FIG. 2) and the display panel 110 (see FIG. 2). The inner plate 160 may be coupled or fixed to the plate 120.

A punching hole 166 may be formed in a flat portion 161 of the inner plate 160. The punching hole 166 may be provided in plurality. The plurality of punching holes 166 may include a first plurality of punching holes 166*a* and a second plurality of punching holes 166*b*. The punching hole 166 may be an oval hole or a long hole. The punching hole 166 may have a major axis L1 and a minor axis L2. The punching hole 166 may be elongated in an up-and-down direction of the inner plate 160. For example, a length of the major axis L1 may be 2 to 3 times a length of the minor axis L2.

The first plurality of punching holes 166*a* may be positioned between a center line CL and a left side SS1 of the inner plate 160. The second plurality of punching holes 166*b* may be positioned between the center line CL and a right side SS2 of the inner plate 160. For example, the punching holes 166 may form 5 columns. As another example, the punching holes 166 may form 14 rows.

The first plurality of punching holes 166*a* may be closer to the left side SS1 of the inner plate 160 than the center line CL. The second plurality of punching holes 166*b* may be closer to the right side SS2 of the inner plate 160 than the center line CL.

The first plurality of punching holes 166*a* may include a first column, a second column, a third column, a fourth column, and a fifth column.

For example, a first gap G1 between the first column and the second column may be substantially equal to a second gap G2 between the second column and the third column. For example, the second gap G2 between the second column and the third column may be substantially equal to a third gap G3 between the third column and the fourth column. For example, the third gap G3 between the third column and the fourth column may be substantially equal to a fourth gap G4 between the fourth column and the fifth column.

Accordingly, while the display device is curved, the degree of curvature matching may be improved. For example, the curvature may be 800 R or 1000 R.

Referring to FIGS. 1 to 27, a display device includes: a flexible display panel; a flexible rear plate positioned at a rear of the display panel and to which the display panel is coupled; a flexible inner plate disposed between the rear plate and the display panel so as to be coupled to the rear plate; a drive moule coupled to a rear of the rear plate, the drive module including a slider configured to linearly reciprocate; a wing that is elongated so that a first end of the wing is coupled to the slider and a second end of the wing is coupled to the rear of the rear plate, the wing including a pivot shaft positioned between the first end and the second end while being adjacent to the first end; and a wing bracket fixed to the rear of the rear plate while being adjacent to the pivot shaft, the wing bracket being coupled to the pivot shaft. The inner plate may include a plurality of holes positioned between the first end and the second end of the wing and may be formed by punching the inner plate. The plurality of holes may be formed in rows and columns and may be arranged long in a direction intersecting a longitudinal direction of the wing.

The inner plate may include: a left side; and a right side opposite the left side. The wing may include: a first wing having a first end coupled to the slider and a second end fixed to the rear of the rear plate while being adjacent to the left side; and a second wing having a first end coupled to the slider and a second end fixed to the rear of the rear plate while being adjacent to the right side. The plurality of holes may include: a first plurality of holes positioned between the second end of the first wing and the slider; and a second plurality of holes positioned between the second end of the second wing and the slider.

The first plurality of holes and the second plurality holes may be symmetric with respect to the slider.

The plurality of holes may each be a long hole elongated in the arrangement direction of the plurality of holes.

The plurality of holes may each have a major axis and a minor axis. A length of the major axis may be 2 to 3 times a length of the minor axis.

The inner plate may have a center line located in a middle between the left side and the right side of the inner plate. The first plurality of holes may be closer to the left side of the inner plate than the center line. The second plurality of holes may be closer to the right side of the inner plate than the center line.

The inner plate may further include a center plate positioned between the first plurality of holes and the second plurality of holes, the center plate being fixed to a front surface of the inner plate.

The inner plate may further include a plurality of cut-outs sequentially formed to be spaced apart from each other along an upper side of the inner plate.

Gaps between the columns formed by the plurality of holes may be substantially equal to each other.

Gaps between the columns formed by the plurality of holes may be gradually reduced from the first end to the second end of the wing.

The drive module may include: a front bracket fixed to the rear of the rear plate; a rear bracket disposed opposite the front bracket; and a lead screw elongated from the front bracket toward the rear bracket, the lead screw being rotatably coupled to the front bracket or the rear bracket. The slider may be screw-coupled with the lead screw so as to linearly reciprocate.

The drive module may further include: a first guide shaft parallel to the lead screw and fixed to the front bracket or the rear bracket; and a second guide shaft parallel to the lead screw and fixed to the front bracket or the rear bracket, the second guide shaft being disposed opposite the first guide shaft with respect to the lead screw.

The drive module may further include a slider guide into which the first guide shaft and the second guide shaft are inserted so that the slider guide is movable on the first guide shaft and the second guide shaft, the slider guide being fixed to the slider.

The wing bracket may include: an upper bracket positioned at an upper part of the wing; a lower bracket positioned at a lower part of the wing; and a pin connecting the upper bracket and the lower bracket, the pin being inserted into the pivot shaft of the wing.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings, and a configuration "B" described in another embodiment of the disclosure and the drawings may be combined with each other. Namely, although the combination between the configurations is not directly described, the combination is possible except in the case where it is described that the combination is impossible.

The above detailed description is to be construed in all aspects as illustrative and not restrictive. The scope of the present disclosure should be determined by reasonable interpretation of the appended claims, and all changes coming within the equivalency range of the present disclosure are intended to be embraced in the scope of the present disclosure.

The invention claimed is:

1. A display device comprising:

a flexible display panel;

a flexible rear plate positioned at a rear of the flexible display panel and to which the flexible display panel is coupled;

a flexible inner plate disposed between the flexible rear plate and the flexible display panel and coupled to the flexible rear plate;

a drive module coupled to a rear of the flexible rear plate, the drive module including a slider linearly reciprocating in a thickness direction of the flexible display panel;

a wing elongated such that a first end of the wing is coupled to the slider and a second end of the wing is coupled to the rear of the flexible rear plate, the wing including a pivot shaft positioned between the first end and the second end, the pivot shaft being adjacent to the first end; and a wing bracket fixed to the rear of the flexible rear plate and being adjacent to the pivot shaft, the wing bracket coupled to the pivot shaft, wherein the flexible inner plate comprises a plurality of holes positioned between the first end and the second end of the wing, the plurality of holes penetrating the flexible inner plate, and wherein the plurality of holes is formed in rows and columns, the rows of the plurality of holes are arranged in a direction intersecting a longitudinal direction of the wing, and the columns of the plurality of holes are arranged in the longitudinal direction of the wing.

2. The display device of claim 1, wherein the flexible inner plate includes:

a left side; and a right side opposite the left side, wherein the wing comprises:

a first wing having a first end coupled to the slider and a second end fixed to the rear of the flexible rear plate, the second end of the first wing being adjacent to the left side; and a second wing having a first end coupled to the slider and a second end fixed to the rear of the flexible rear plate, the second end of the second wing being adjacent to the right side, and wherein the plurality of holes comprises:

a first plurality of holes positioned between the second end of the first wing and the slider; and a second plurality of holes positioned between the second end of the second wing and the slider.

3. The display device of claim 2, wherein the first plurality of holes and the second plurality of holes are symmetric with respect to the slider.

4. The display device of claim 2, wherein each of the plurality of holes is a long hole elongated in the direction intersecting the longitudinal direction of the wing.

5. The display device of claim 4, wherein each of the plurality of holes includes a major axis and a minor axis, and wherein a length of the major axis is 2 to 3 times a length of the minor axis.

6. The display device of claim 3, wherein the flexible inner plate has a center line located in a middle between the left side and the right side of the flexible inner plate, wherein the first plurality of holes is closer to the left side of the flexible inner plate than the center line, and wherein the second plurality of holes is closer to the right side of the flexible inner plate than the center line.

7. The display device of claim 2, wherein the flexible inner plate further comprises a center plate positioned between the first plurality of holes and the second plurality of holes, the center plate being fixed to a front surface of the flexible inner plate.

8. The display device of claim 1, wherein the flexible inner plate further comprises a plurality of cut-outs sequentially formed to be spaced apart from each other along an upper side of the flexible inner plate.

9. The display device of claim 1, wherein gaps between the columns formed by the plurality of holes are substantially equal to each other.

10. The display device of claim 1, wherein gaps between the columns formed by the plurality of holes are gradually reduced from the first end to the second end of the wing.

11. The display device of claim 1, wherein the drive module comprises:

a front bracket fixed to the rear of the flexible rear plate;

a rear bracket facing the front bracket; and a lead screw elongated from the front bracket toward the rear bracket, the lead screw being rotatably coupled to the front bracket or the rear bracket, and wherein the slider is screw-coupled with the lead screw and linearly reciprocating.

12. The display device of claim 11, wherein the drive module further comprises:

a first guide shaft parallel to the lead screw and fixed to the front bracket or the rear bracket; and a second guide shaft parallel to the lead screw and fixed to the front bracket or the rear bracket, the second guide shaft being disposed opposite the first guide shaft with respect to the lead screw.

13. The display device of claim 12, wherein the drive module further comprises a slider guide into which the first guide shaft and the second guide shaft are inserted so that the slider guide is movable on the first guide shaft and the second guide shaft, the slider guide being fixed to the slider.

14. The display device of claim 1, wherein the wing bracket comprises:

an upper bracket positioned at an upper part of the wing;

a lower bracket positioned at a lower part of the wing; and a pin connecting the upper bracket and the lower bracket, the pin being inserted into the pivot shaft of the wing.

* * * * *